US005170322A

United States Patent [19]

von Guttenberg

[11] Patent Number: 5,170,322

[45] Date of Patent: Dec. 8, 1992

[54] ELECTROMAGNETIC RELAY SYSTEM HAVING A CONTROL MODULE THERMALLY COUPLED TO A TERMINAL ELEMENT ACTING AS A HEAT SHEILD AND COOLING PLATE

[75] Inventor: Florenz von Guttenberg, Berlin, Fed. Rep. of Germany

[73] Assignee: Siemens Aktiengesellschaft, Munich, Fed. Rep. of Germany

[21] Appl. No.: 783,808

[22] Filed: Oct. 29, 1991

[30] Foreign Application Priority Data

Nov. 9, 1990 [EP] European Pat. Off. ........ 90121500.4

[51] Int. Cl.[5] ............ H05K 7/20

[52] U.S. Cl. ............ 361/386; 335/202; 361/392; 361/395

[58] Field of Search ............ 335/202; 361/386-389, 361/392, 394, 395, 399

[56] References Cited

U.S. PATENT DOCUMENTS

| | | | |
|---|---|---|---|
| 4,060,847 | 11/1977 | Penrod | 361/387 |
| 4,837,538 | 6/1989 | Dittman | 335/202 |
| 5,018,050 | 5/1991 | Maenishi et al. | 361/386 |
| 5,079,672 | 1/1992 | Haubner et al. | 361/387 |

FOREIGN PATENT DOCUMENTS

| | | |
|---|---|---|
| 0281950 | 3/1988 | European Pat. Off. . |
| 3614910 | 2/1989 | Fed. Rep. of Germany . |

*Primary Examiner*—Gregory D. Thompson

*Attorney, Agent, or Firm*—Hill, Van Santen, Steadman & Simpson

[57] ABSTRACT

An electromagnetic relay has a control module in the form of an integrated circuit connected to a section of a flat plug inside the housing. The flat plug acts as a heat shield and as a cooling plate for the integrated circuit.

11 Claims, 2 Drawing Sheets

ELECTROMAGNETIC RELAY SYSTEM HAVING A CONTROL MODULE THERMALLY COUPLED TO A TERMINAL ELEMENT ACTING AS A HEAT SHEILD AND COOLING PLATE

BACKGROUND OF THE INVENTION

The invention is directed to an electromagnetic relay having a housing, terminal elements guided out of the housing, and a control module in the form of an integrated circuit arranged in the housing.

It is already known in an electromagnetic relay to accommodate a control module in an outwardly open chamber of the bottom plate, the terminal pins of this control module being arranged parallel to the terminal pins of the relay (DE 36 14 919 C2). As long as this known relay is operated in normal ambient temperatures, the control module having electronic components will also not heat to an impermissible degree, so that the function is guaranteed. Given this and other known relays having integrated circuits arranged within the housing, however, reliable operation has previously only been guaranteed when the thermal stress due to coil heating and contacts as well as ambient temperature does not proceed beyond the loadability of the electronic components. Such integrated circuits can only be loaded up to an upper limit temperature of 150° C. Temperatures proceeding beyond this considerably shorten the useful life of these components.

Given relays for specific purposes, however, there is the need for a regulation of the control voltage or of the coil current given a simultaneously high thermal loading due both to high switching currents in the interior of the relay as well as due to high ambient temperatures. A typical application for such a relay is a motor vehicle wherein the contacts must carry extremely high currents at low voltages, while the ambient temperature fluctuates greatly and, for example, can amount to up to 125° C. When the self-heating of the relay is then added, thermal loads up to 200° C. thus result, temperatures which an integrated circuit cannot withstand. A regulation of the control voltage, however, is desirable or required precisely because of the great temperature fluctuations. Thus, one would also like to accommodate the control modules in the relay housing in this case as well as for saving space and assembly work.

SUMMARY OF THE INVENTION

It is an object of the invention to create a relay of the type initially cited having an integrated circuit as a control module accommodated in the relay housing. The harmful influences of elevated temperatures, whether due to dissipated heat in the coil and contacts or due to the self-heating of the circuit, can be eliminated or at least significantly alleviated with optimally small structural expense.

This object is achieved in that at least one of the terminal elements designed as a flat plug is utilized as a cooling plate which has a coupling section at its flat side thermally coupled to the substrate of the integrated circuit.

Due to the employment according to the invention of one or more flat plugs in the relay as a cooling plate for the integrated circuit, an efficient heat elimination can occur without requiring additional parts. The flat plugs are employed as a standard, for example for motor vehicle relays, and have a standardized width of 6.3 or 9.5 mm, given a thickness of 0.8 to 1.2 mm. Such a large cross section makes a good heat elimination possible since the cabling connected to the flat plug via a plug-in socket or via a cable shoe continues to carry the heat away. In previous relays, the large cross section of the flat plugs for the terminal elements of the contacts is important because of the high switching currents, whereas the coil terminals need only basically carry a relatively low current. According to standards, however, the coil terminal flat plugs have the same cross section. An additional, advantageous utilization of this large plug cross section that is already present for heat elimination thus results for the control module to be connected to the coil.

When the integrated circuit is arranged on a base plate of the housing or in a depression of the base plate, then the coupling section of the flat plug is preferably arranged above it such that the circuit is shielded from heat sources in the relay. The thermal coupling between the integrated circuit and the flat plug can thus be undertaken with a thermally conductive paste or with other means when the integrated circuit and the flat plug are mounted as discrete parts. However, it is also possible to provide the integrated circuit with an integrated cooling plate of one piece construction therewith from the very outset in the fashion of a power semiconductor, the flat plug being integrally applied to this cooling plate as a continuation thereof. In this case, one terminal of the circuit can be directly electrically contacted to the cooling plate or to the flat plug.

In a further development of the invention, the integrated circuit can also be arranged flat thermally conductive coupling between parallel coupling sections of two flat plugs, whereby it is firmly joined to at least one of the flat plugs. In this case, thus the heat elimination is undertaken via two flat plugs, and thus even more efficiently. When the materials allow it, the integrated circuit can be firmly joined to both flat plugs, whereby one respective terminal of the circuit is contacted with one of the flat plugs. When, however, a relative motion due to thermal expansion of the various parts must be taken into consideration, then only one of the flat plugs is firmly joined to the integrated circuit, whereas the second flat plug is loosely coupled, but likewise in thermally conductive fashion, and is contacted to the corresponding terminal element of the integrated circuit via a flexible connection.

The integrated circuit together with the respective coupling section of the flat plug or flat plugs can be at least partially arranged within the base plate, and is preferably embedded therein. Various ways of fastening are possible. Given plugging into recesses of the base plate, the remaining openings can be closed with casting compound, the flexible connections, for example, being thereby covered and sealed. This is particularly advantageous when the plugging or the embedding of the flat plugs together with the integrated circuit is undertaken in the region of a depression that is only accessible from the outside of the relay housing. A subsequent sealing is desirable in this case in all instances.

DESCRIPTION OF THE PREFERRED EMBODIMENTS

Figure 1:
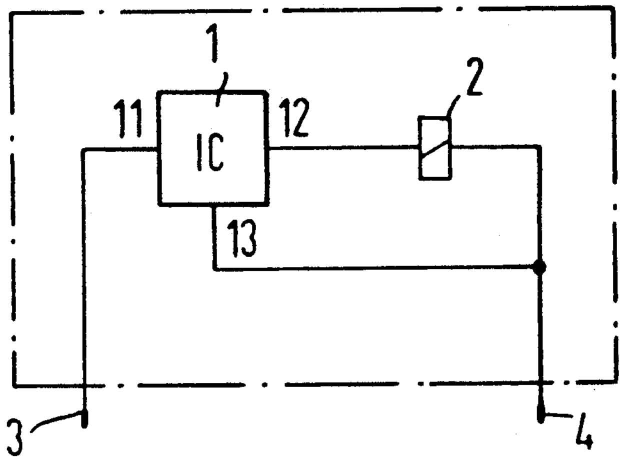
FIG. 1 shows a fundamental circuit of a control circuit having a coil in a relay housing.

FIG. 1 fundamentally shows the connection of a control module in the form of an integrated circuit 1 for the drive of a control coil 2 in a relay. The coil terminals 3 and 4 thus lead toward the outside, these coil terminals 3 and 4 being partly directly and partly indirectly connected in the inside of the relay to the coil 2 via the three terminals 11, 12, and 13 of the integrated circuit.

Figure 2:
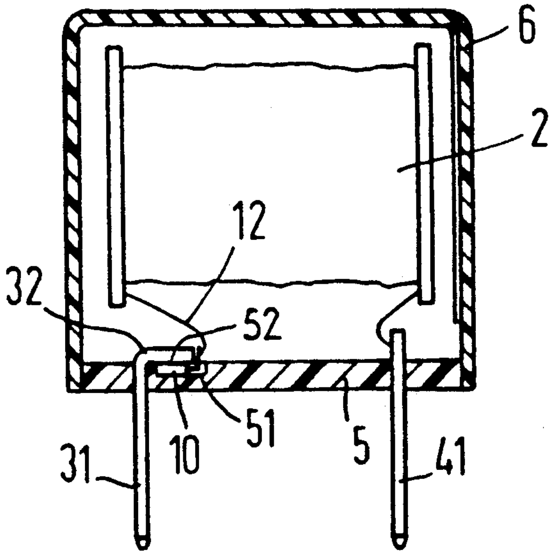
FIG. 2 is a schematically illustrated relay housing having a shielded integrated circuit in the region of a base plate.

In a schematic, sectional view of a relay housing having a cap 6 and a base plate 5, FIG. 2 shows the arrangement of the coil 2 and its connection to the coil terminals 3 and 4, which are designed as flat plugs 31 and 41. At the inside of the base plate 5, the flat plug 31 has a bent-off coupling section 32 that shields the integrated circuit 10 arranged in a depression 51 of the base plate 5 from the coil and from other heat sources (not shown) in the relay. A good thermal connection between the integrated circuit 10 (such as at a substrate surface thereof) and the coupling section 32 of the flat plug is produced with a thermally conductive paste 52.

Figure 3:
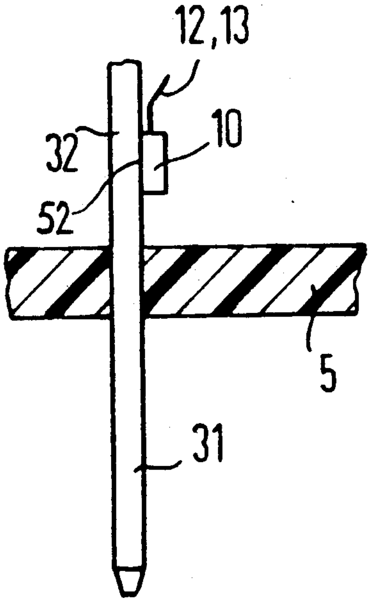
FIGS. 3 and 4 illustrate a portion of a base plate having a flat plug which, as a cooling plate, forms a uniform component with an integrated circuit.
Figure 4:
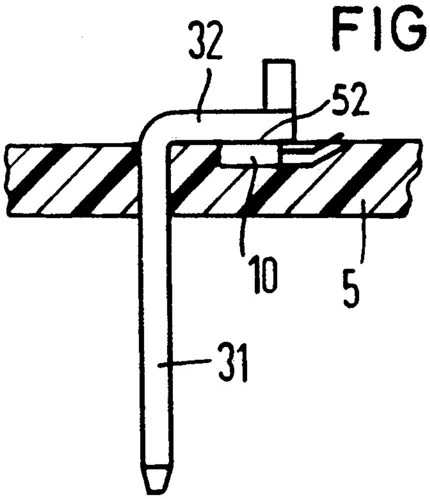

FIGS. 3 and 4 show an integrated circuit 1 that is manufactured as a one-piece component with a coupling section 32 in the form of a cooling plate, whereby the flat plug 31 is immediately applied to this cooling plate. The cooling plate in the form of the coupling section 32 thereby directly forms the circuit terminal 11 of FIG. 1, whereas the two terminals 12 and 13 are separately guided out. The cooling plate in the form of the coupling section 32 can, according to FIG. 3, be vertically anchored with the flat plug 31 in the base plate 5 or, according to FIG. 4, can be anchored in the base plate 5 in angled-off fashion.

Figure 5:
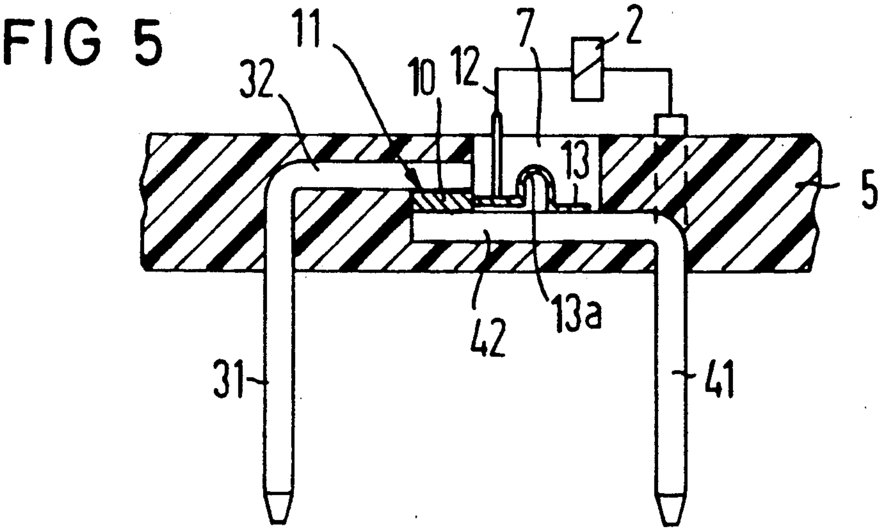
FIGS. 5 through 7 show an arrangement of an integrated circuit between two cooling plates in various positions in a base plate.
Figure 7:
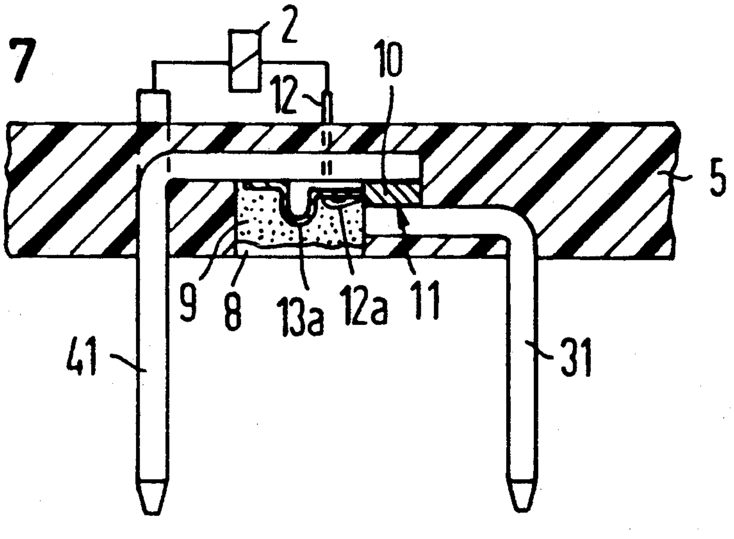

FIGS. 5 and 7 show an embodiment wherein an angled-off coupling section 32 of the flat plug 31 and an angled-off, second coupling section 42 of the flat plug 41 overlap one another in parallel. The integrated circuit 10 is inserted in the overlap region between these two coupling sections, whereby it is firmly joined to the coupling section 32, but is only loosely and also thermally conductively joined to the coupling section 42. The heat elimination can thereby also be assured by a thermally conductive paste. Since the coupling section 42 also requires an electrical connection to the terminal 13 of the integrated circuit 10, this connection 13a is flexibly designed and separately contacted. In this exemplary embodiment, the two flat plugs have their coupling sections 32 and 42 firmly anchored in the base plate 5 by plugging or embedding, whereby the flexible connection 13a and the terminal 12 guided to the coil are accessible in an opening 7 toward the inside of the housing. If necessary, this opening can be subsequently closed or extrusion-coated by a casting compound or the like.

Figure 6:
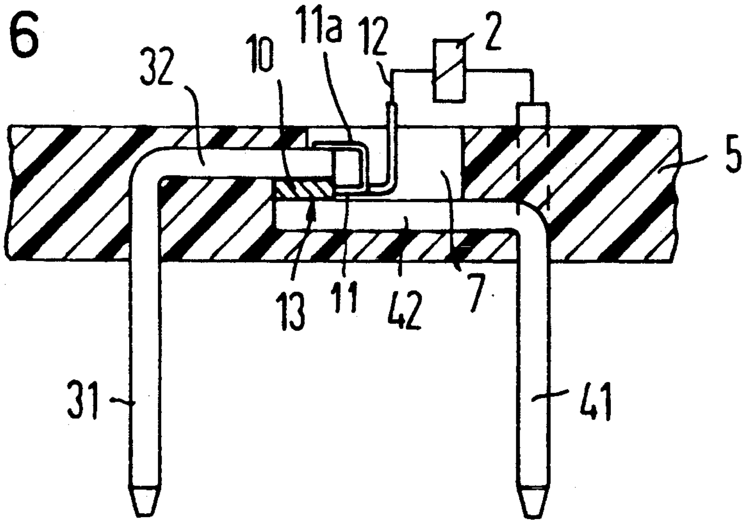

FIG. 6 shows a similar arrangement of the flat plugs 31 and 41, whereby a firm coupling between the integrated circuit 10 and the coupling section 42 is provided in this case. A loose coupling is thus formed between the integrated circuit 10 and the coupling section 32. The terminal 11 of the integrated circuit in this case is therefore contacted to the coupling section 32 via a flexible connection 11a.

The arrangement of FIG. 6 is modified in FIG. 7 to the extent that an embedding or other anchoring of the coupling sections 32 and 42 is now undertaken such that a depression 8 is accessible from the outside. In order to protect the flexible connections 12a and 13a in this case, this depression can be subsequently closed with a casting compound 9. However, it is also conceivable in this case to embed the flat plugs and the integrated circuit in common into the base plate 5 such that all terminals are insulated and sealed from the very outset.

Although various minor changes and modifications might be proposed by those skilled in the art, it will be understood that I wish to include within the claims of the patent warranted hereon all such changes and modifications as reasonably come within my contribution to the art.

I claim as my invention:

1. An electromagnetic relay system, comprising:
   a housing;
   a relay having a control coil in the housing;
   terminal elements guided out of the housing;
   a control module comprising an integrated circuit arranged in said housing and electrically connected to control said relay control coil, said terminal elements being electrically connected to at least one of said relay and control module;
   at least one of the terminal elements comprising a flat plug employed as a cooling plate; and
   a flat coupling section of the flat plug being thermally coupled to said integrated circuit.

2. A relay system according to claim 1 wherein the integrated circuit is arranged at a base plate of the housing and positioned so that it is shielded from heat sources in the relay by the coupling section of the flat plug.

3. A relay system according to claim 1 wherein the integrated circuit is arranged in a depression of the base plate and is positioned so that it is shielded from heat sources in the relay by the coupling section of the flat plug.

4. A relay system according to claim 1 wherein the thermal coupling between the integrated circuit and the flat coupling section of the flat plug includes a thermally conductive paste.

5. A relay system according to claim 1 wherein the flat coupling section comprises an integrated cooling plate which is thermally coupled with the integrated circuit.

6. A relay system according to claim 1 wherein both of the terminal elements comprise flat plugs each of which have coupling sections, and wherein said integrated circuit is thermally coupled to and between the coupling sections.

7. An electromagnetic relay system, comprising:
   a housing;
   a relay having a control coil in the housing;
   terminal elements guided out of the housing;
   a control module comprising an integrated circuit arranged in said housing and electrically connected to control said relay control coil, said terminal elements being electrically connected to at least one of said relay and control module;
   each of the terminal elements comprising a flat plug having a coupling section, each flat plug functioning as a cooling plate;

said integrated circuit being thermally coupled to and between the flat coupling sections of the flat plugs; and the integrated circuit being relatively rigidly coupled to one of the flat plugs, being relatively loosely coupled to the other flat plug, and being electrically contacted to one of the flat plugs via a flexible connection.

8. A relay system according to claim 7 wherein a region of the flexible connection is sealed with casting compound.

9. A relay system according to claim 7 wherein a region of the flexible connection is injection molded in casting compound.

10. A relay system according to claim 1 wherein the integrated circuit together with the coupling section of the flat plug is at least partially located inside the base plate.

11. An electromagnetic relay system, comprising:

a housing;

a relay having a control coil in the housing;

terminal elements guided out of the housing;

a control module comprising an integrated circuit arranged at said housing and electrically connected to control said relay control coil, and said terminal elements being electrically connected to at least one of said relay and control module; and at least one of the terminal elements having a flat portion mounted directly to said integrated circuit so as to serve as a cooling plate therefor.

* * * * *